(12) United States Patent
Gao

(10) Patent No.: US 11,589,478 B2
(45) Date of Patent: Feb. 21, 2023

(54) LIQUID COOLING LEAKAGE PREVENTION DESIGN

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/221,165

(22) Filed: Apr. 2, 2021

(65) Prior Publication Data

US 2022/0322574 A1 Oct. 6, 2022

(51) Int. Cl.
*H05K 7/20* (2006.01)
*G01M 3/20* (2006.01)

(52) U.S. Cl.
CPC .......... *H05K 7/20254* (2013.01); *G01M 3/20* (2013.01); *H05K 7/20772* (2013.01)

(58) Field of Classification Search
CPC ........... H05K 7/20218; H05K 7/20254; H05K 7/20627; H05K 7/20636; H05K 7/20763–20772; C09K 5/10; G01M 3/20
See application file for complete search history.

(56) References Cited

U.S. PATENT DOCUMENTS

| 7,104,313 | B2* | 9/2006 | Pokharna | H02K 44/04 |
| | | | | 257/E23.098 |
| 10,925,190 | B2* | 2/2021 | Gao | H05K 7/20254 |
| 11,310,938 | B2* | 4/2022 | Su | H05K 7/20254 |
| 2014/0076524 | A1* | 3/2014 | Boday | B29C 48/151 |
| | | | | 165/104.33 |
| 2022/0034743 | A1* | 2/2022 | Acharya | G01M 3/165 |
| 2022/0065727 | A1* | 3/2022 | Faradzhev | H01J 37/261 |

* cited by examiner

*Primary Examiner* — Zachary Pape
(74) *Attorney, Agent, or Firm* — Womble Bond Dickinson (US) LLP

(57) ABSTRACT

A leakage prevention system including a cold plate is proposed in the current application. In one embodiment, a cold plate comprises an inlet port to receive cooling fluid from an external cooling source; an outlet port to return the cooling fluid back to the external cooling source; a sealing notch integrated with a sealing pad included in an outside layer of the cold plate; a nanoparticle channel disposed inside the outside layer; the nanoparticle channel is filled with a plurality of nanoparticles; a cooling area disposed inside the nanoparticle channel; the cooling area is to receive the cooling fluid from the inlet port, to exchange heat generated by an electronic device attached to the cold plate and carried by the fluid, and to return the cooling fluid via the outlet port; the plurality of nanoparticles in cooling fluid is used to detect a leakage of the cooling fluid.

18 Claims, 10 Drawing Sheets

LIQUID COOLING LEAKAGE PREVENTION DESIGN

FIELD OF THE INVENTION

Embodiments of the present invention relate generally to server and data center cooling. More particularly, embodiments of the invention relate to a liquid cooling leakage detection and prevention design of a cooling system for cooling of electronics devices such as data center.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

It is extremely critical to keep high reliability in liquid cooling. Therefore, preventing leakage is extremely important for deploying such technology in data center in scale. Further, preventing leakage is not only relying on designing the product in high quality, it also needs advanced detection and prevention mechanism to provide accurate leak detection for all the leaking scenarios.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
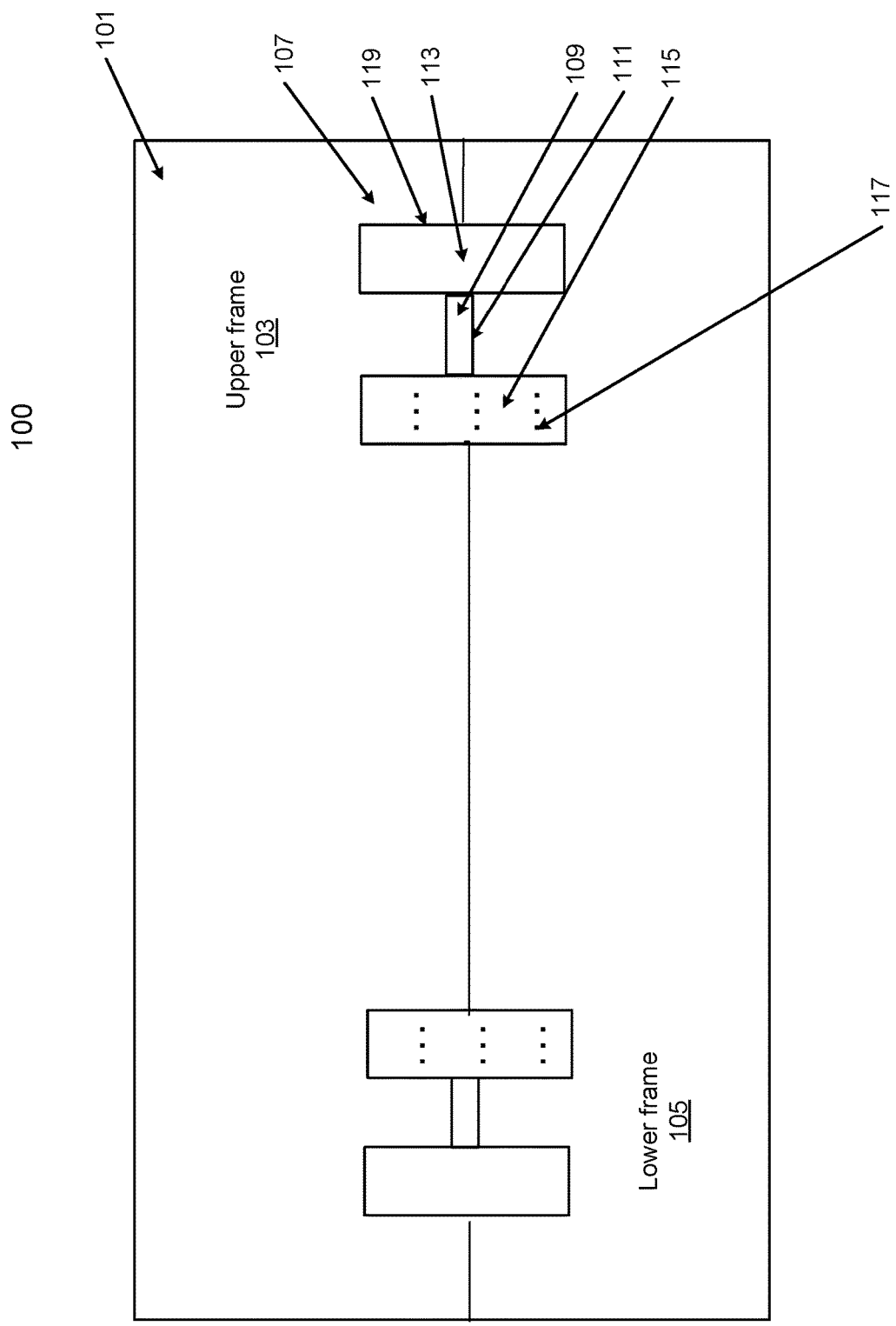
FIG. 1 shows a cross section view of an example liquid cooling leakage prevention design in a cooling unit of a cooling system according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and AI computing related business service users and providers who build, operate, compute, store and manage other IT hardware platforms (e.g., servers) and infrastructures. The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architecture.

In an embodiment, the design proposed in the current disclosure aims to be applied in liquid cooling solutions for server and electronics' packages (e.g., processors). For example, reliability is always a challenge in liquid cooling solutions for servers. In an embodiment, since liquid cooling requires the running of fluid close to the electronics (e.g., processors) within the chassis, any liquid leak may cause a series of damages to the entire system and electronics. Therefore, preventing leaking is critical for the liquid cooling solutions reliability, so that it can be deployed on a large scale. The current application provides an innovative design for liquid cooling leak detection to prevent damages caused by liquid leak.

In an embodiment, a requirement for the leak detection systems for server liquid cooling is that the system needs to precisely identify the actual leaking location in a leaking incident. In other words, in the server liquid cooling application, this is a critical requirement since the detection system needs to identify at which server or even which chip that is causing leaking. For example, in data centers, there are many liquid-cooled servers that are connected in a cooling loop, allowing leakages that may happen in any servers or locations along the loop. In an embodiment, the design of the liquid cooling leakage prevention mechanism may enable the server liquid cooling leak detection system to more accurately identify the leaking locations so that the system can provide precise leaking locations in any leaking incidents. In an embodiment, in addition, by implementing the sensors in different manners, the proposed design can be used to change leak detection accuracy on scales ranging from the device level, the server cooling module level, the rack level, and beyond. For example, the coverage range of a single sensor is based on its locations. In an embodiment, a single sensor may be used to cover the entire server, or a rack.

The cost of the leak detection is also a challenging problem. Not only is the detection system hardware costly, but also the corresponding sensors and control systems are too. If the leak detection system utilizes the majority of the cooling hardware cost budget, the solution may not be deployed successfully in the actual product. This is also one of the major resistances for liquid cooling being able to be deployed in scale as well as the corresponding eco system development.

In addition, high scalability and interoperability are critical features for leak detection solutions since the solution may need to be used for different liquid cooling components using in a server cooling module. The design concept and supporting technologies proposed in the current invention may implemented for a variety of cases.

The most important feature for a leak detection system or solution for mission critical equipment is being able to detect and pinpoint the potential leak before the leak happens as well as identifying the potential leak location. This is the problem the present application aims to solve.

The present application introduces a novel solution that designs and develops a leak detection solution for liquid cooling servers or mission critical equipment. The solution enables preventive leak detection, to catch the leak before any actual damage can occur. The solution also identifies the locations of these potential leaks, on a small and large scale.

In one embodiment, the present application introduces the nanoparticle based leak detection solution. It does not impact the system's performance and reliability. For example, once the internal leak is detected, for example, by detecting the presence of nanoparticles in the cooling fluid, the unit that causes the leaking will be easily identified and replaced, however, at the same time, the detection medium may still keep running within the entire system.

In an embodiment, a cooling system includes a cold plate comprising an inlet port, an outlet port, a sealing notch, a nanoparticle channel, and a cooling area. In an embodiment, the inlet port is to receive cooling fluid from an external cooling source. The outlet port is to return the cooling fluid back to the external cooling source. For example, a sealing notch is integrated with a sealing pad included in an outside layer of the cold plate. In an embodiment, a nanoparticle channel disposed inside the outside layer. For example, the nanoparticle channel is filled with a plurality of nanoparticles. In an embodiment, a cooling area is disposed inside the nanoparticle channel. For example, the cooling area is to receive the cooling fluid from the inlet port, to exchange heat generated by an electronic device attached to the cold plate and carried by the fluid, and to return the cooling fluid via the outlet port. For example, the plurality of nanoparticles in cooling fluid is used to detect a leakage of the cooling fluid.

In an embodiment, a cold plate includes a capsule layer used for containing the plurality of nanoparticles soluble in cooling fluid. In an embodiment, the plurality of nanoparticles with capsule layer can be dissolved into the cooling fluid. In an embodiment, the plurality of nanoparticles are integrated to a barb and hose component. In an embodiment, a cold plate includes a nanoparticle sensor used in its discharge side of a loop coupled with the outlet port to detect the plurality of nanoparticles in the cooling fluid.

In an embodiment, the cooling fluid flows to the nanoparticle channel through a leaking path due to one more conditions. In an embodiment, the one or more conditions include product design, manufacture error, improper integration, improper operation, or a combination thereof. In an embodiment, the plurality of nanoparticles are exposed to the cooling fluid flowing to the nanoparticle channel through the leaking path. In an embodiment, the plurality of nanoparticles flow together with the cooling fluid appeared in the supply side of the loop coupled with the outlet port, when the entire system is still functioning and no leak outside the cool plate into the one or more electronic devices.

The present application introduces a leak detection design and solution for sever liquid cooling. In an embodiment, nanoparticles such as the copper nanoparticle are utilized in the design, and are used for detecting the leak. For example, the nanoparticles are packaged within the capsule in an embodiment, and the capsule together with the nanoparticles are integrated into the cooling modules, cooling parts, or any other possible leak locations. In an embodiment, the dedicated channel is developed within a cold plate for assembling the nanoparticles. In an embodiment, there is another sealing structure which is used for preventing leakages to cause damages to the electronics. In an embodiment, the nanoparticles will be dissolved into the cooling fluid, and then the fluid downstream will contain the nanoparticle. For example, once the fluid flowing carrying the nanoparticles through the nanoparticle sensor, it triggers a corresponding sensor. In an embodiment, the fluid still contained within the components are protected with additional sealing layers, so that the leak is prevented and identified, before it leaks out contacting any electronics.

FIG. 1 shows a cross section view of an example liquid cooling leakage prevention design 100 in a cooling unit of a cooling system according to an embodiment of the application. For example, FIG. 1 shows the leak detection design 100 in a commonly used cold plate 101. In particular, FIG. 1 is a side view of the cold plate 101. In an embodiment, the leaking detection and prevention design 101 are implemented in the middle of the two frames (i.e., upper frame 103 and lower frame 105) that form the cold plate, since the only possible leakage may happen between the two contacting layers (103, 105). In an embodiment, the internal are the channels (e.g., 115) for implementing nanoparticles (e.g., 117). In an embodiment, the detection channel 115 is the dedicated notch filled with nanoparticles 117. For example, besides the nanoparticle layers, there is a sealing notch (e.g., 109, 113) or different sealing structure 107 integrated with the sealing pad (e.g., 111, 119). The key design is using the nanoparticle channel closer to the fluid area which will be discussed in more details. It need to be noted that cooling area where the fluid running through is not shown in FIG. 1. The sealing pad (e.g., 111, 119) may be different to accommodate different sealing notch (e.g., 109, 113) design.

Figure 2:
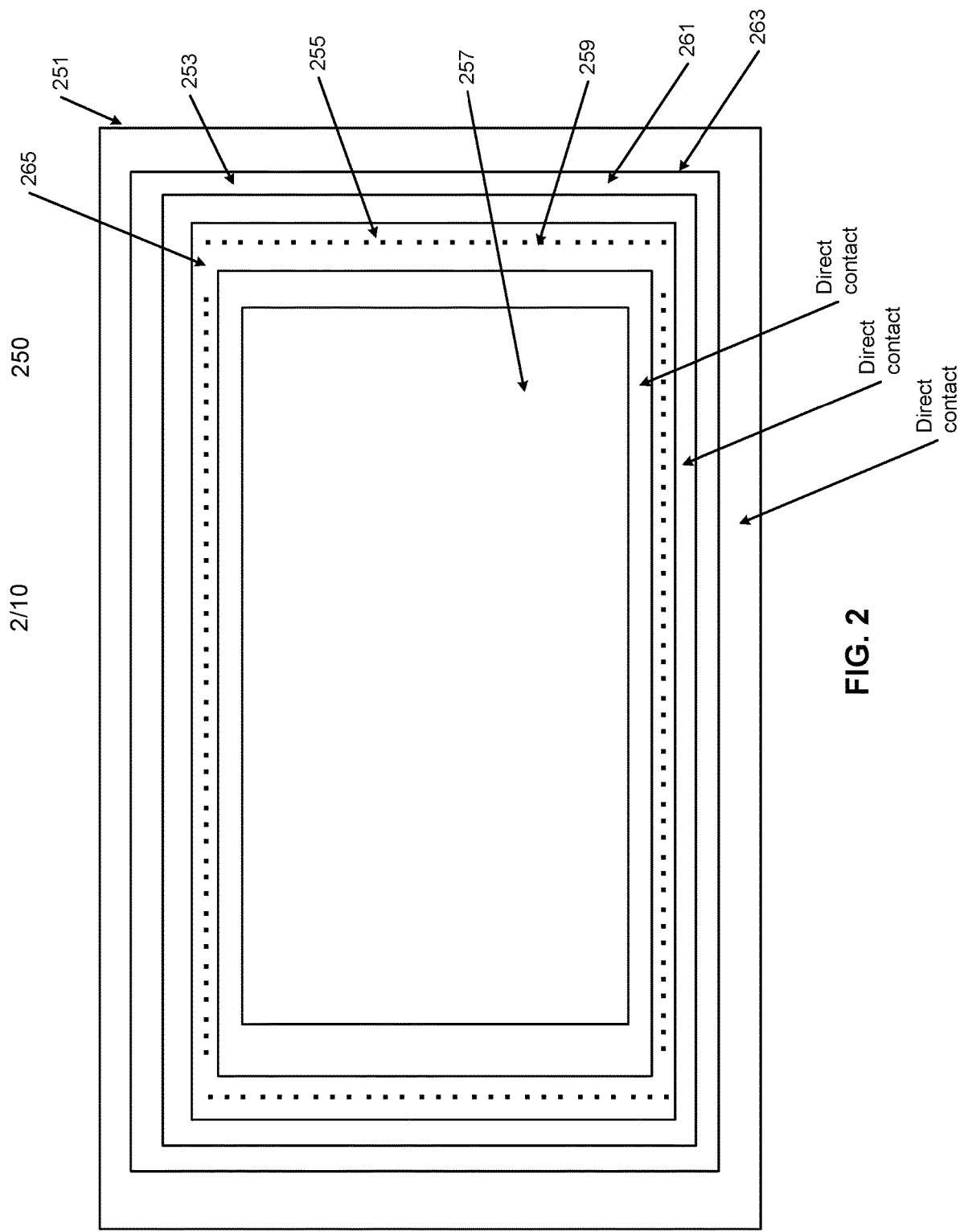
FIG. 2 shows a top view of an example liquid cooling leakage prevention design with nanoparticles in a cooling unit of a cooling system according to an embodiment of the application.

FIG. 2 shows a top view of an example liquid cooling leakage prevention design 250 with nanoparticles in a cooling unit of a cooling system according to an embodiment of the application. For example, FIG. 2 shows the top view of the solution for a cold plate cover by a frame 251 as an example. It can be seen that the nanoparticles 259 are assembled or added to the dedicated channel 265 according to an embodiment. In an embodiment, the outside layer includes the sealing notch 261 where the sealing pad 263 is integrated. For example, when a leakage occurs between two frames 103, 105 (e.g., if the two layers are not contacting with each other properly), the fluid will flow to the nanoparticles channel 265 first.

In an embodiment, since the detection is designed to work on this layer, the leak can be identified before fluid leaking out. That is, the sealing pad 263 provides additional protection. In an embodiment, it may be not strongly necessary to add a sealing layer, however, sealing layer does provide reliability enhancement. It should be noted that the sealing notch (e.g., 261) and pad (e.g., 263) can be customized depending or the fabrication procedure and complexity as well as cost.

In an embodiment, since the cooling area 257 (e.g., the micro-channel water fin area) is separated from the nanoparticle channel 265, the fluid will not be in contact with any of the particle (e.g., 259) or the nanoparticle channel 265.

Figure 3A:
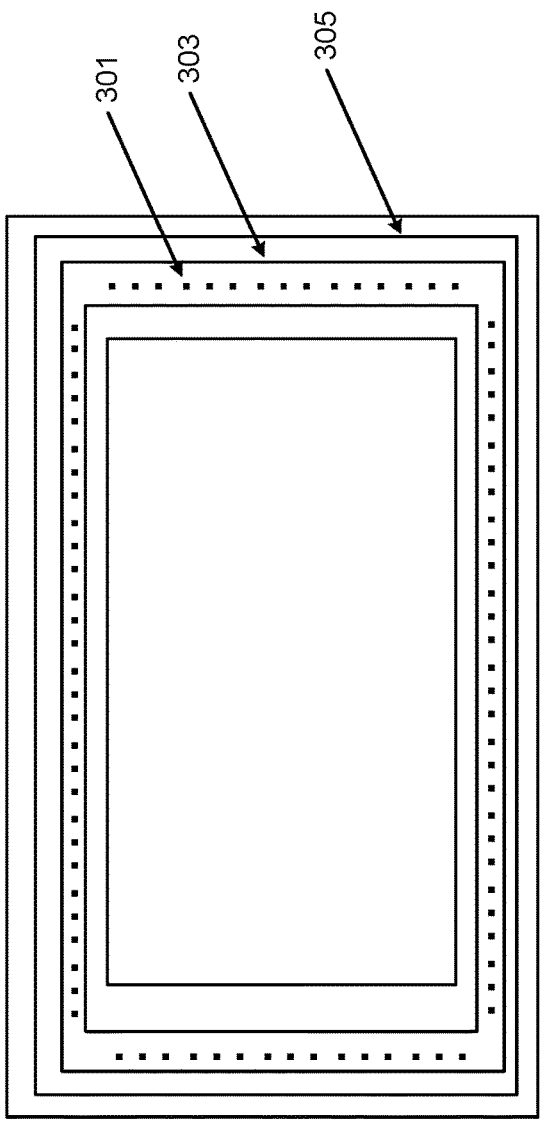
FIG. 3A-3B show top views of other example liquid cooling leakage prevention designs with nanoparticles in a cooling unit of a cooling system according to an embodiment of the application.
Figure 3B:
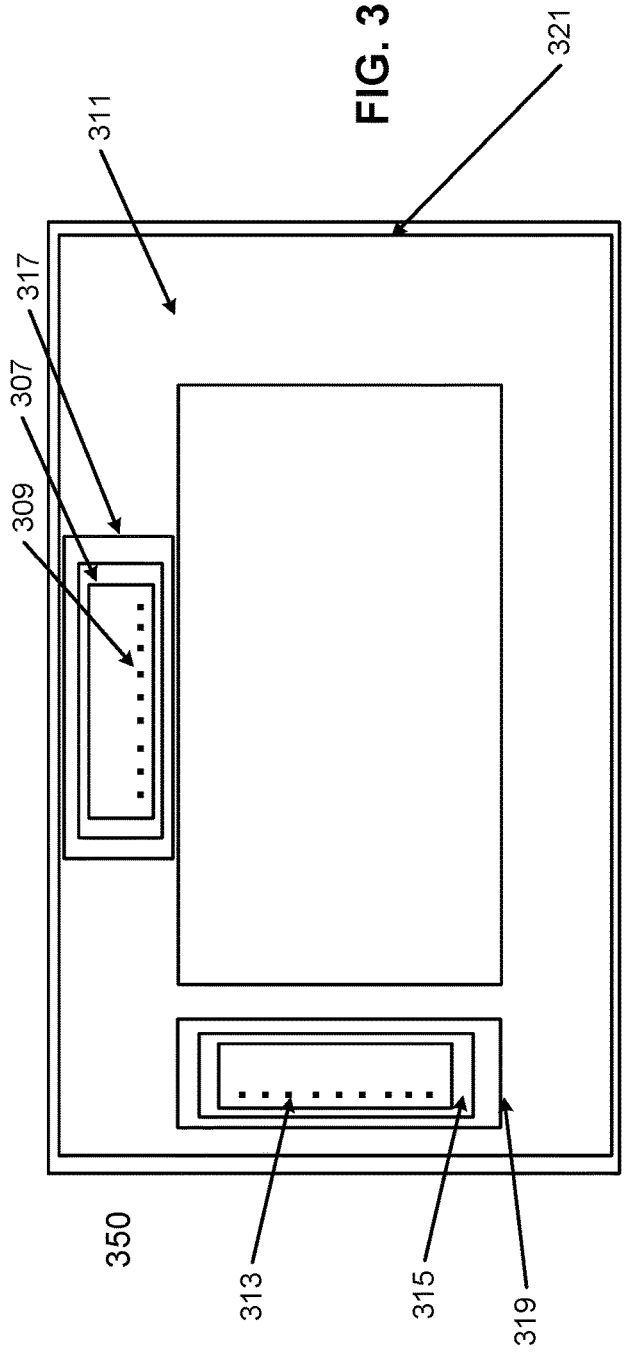

FIG. 3A-3B show top views of other example liquid cooling leakage prevention design mechanism with nanoparticles (e.g., 301, 309, 313) in a cooling unit (e.g., 300, 350) of a cooling system according to an embodiment of the application. For example, FIG. 3A-3B show some advanced feature of the nanoparticle implementation proposed in the current application. In an embodiment, as shown in the FIGS. 3A and 3B, the nanoparticle channel (e.g., 305) is the predesigned channel on the cooling hardware.

In an embodiment, the nanoparticles (e.g., 301, 309, 313) are added in a capsule layer (e.g., 303, 307, 315) covered by one or more sealing layer (e.g., 305, 317, 319, 321) outside the capsule layer (e.g., 303, 307, 315). In an embodiment, the material of the capsule layer (e.g., 303, 307, 315) which is used for containing the particles (e.g., 301, 309, 313) is easily soluble in liquid. If there is a leak, the nanoparticles will leak into the circulated cooling fluid, where the nanoparticles may be detected by a sensor or alternatively, the nanoparticles may be visually spotted by an operator or user.

In an embodiment, the design (e.g., 300, 350) is to make sure the detection system can be accurate to have the nanoparticles (e.g., 301, 309, 313) contained before the operation. In an embodiment, another feature (e.g., nanoparticle unit) can be designed as standard module and partially implemented in the dedicated channels.

Figure 4:
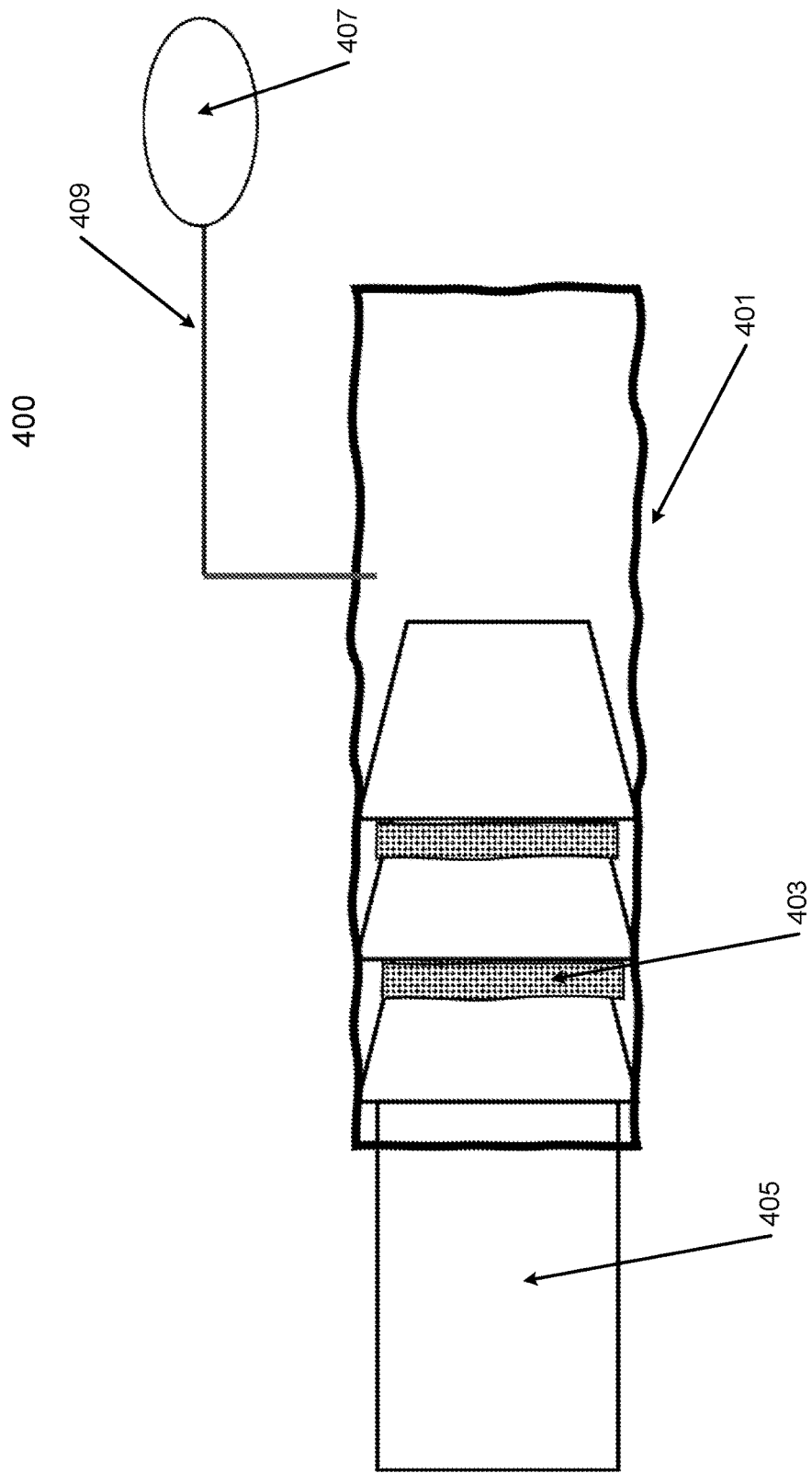
FIG. 4 shows an example nanoparticle implementation for a cooling system according to an embodiment of the application.

FIG. 4 shows an example nanoparticle implementation for a cooling system according to an embodiment of the application. For example, FIG. 4 shows another design 400 for designing the leak detection using the nanoparticle implementation. In an embodiment, the nanoparticles 403 are integrated to a barb 405 and hose structure 401. In an embodiment, a sensor 407 (e.g., a copper nanoparticle 403 detection sensor 407) is used in the supply side of the loop connected with hose structure 407 through sensor wires 409. In an embodiment, sensor wires 409 and sensor 407 can be implanted at any location depending on the leak detection design on the downstream of the 400. Sensor 407 can detect the presence of the nanoparticles in the cooling fluid if there is a leak.

Figure 5:
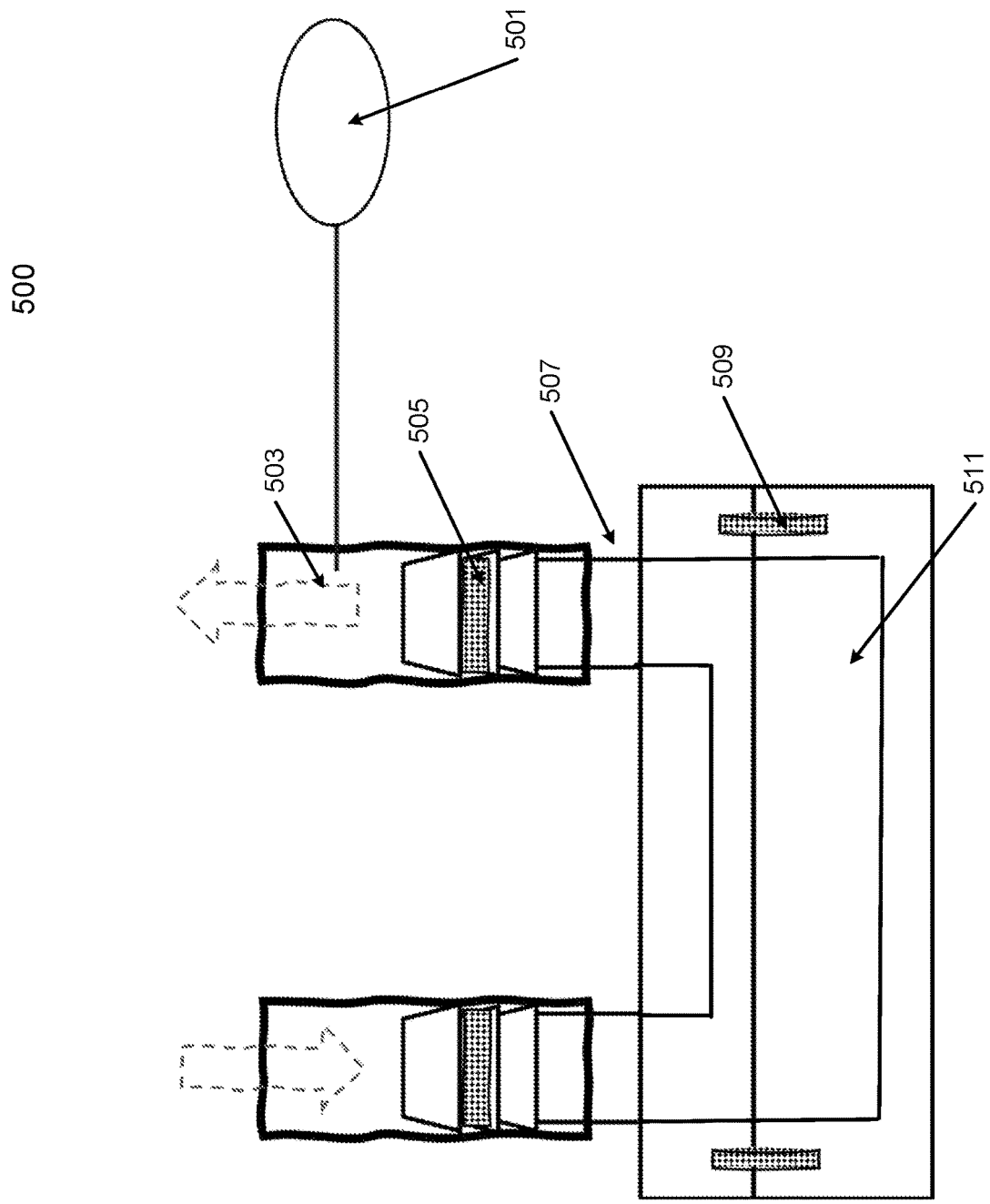
FIG. 5 shows an example liquid cooling leakage prevention design with nanoparticle implementation in a cooling unit of a cooling module as a section of a cooling system according to an embodiment of the application.

FIG. 5 shows an example liquid cooling leakage prevention design 500 with nanoparticle implementation in a cooling unit of a cooling module as a section of a cooling system according to an embodiment of the application. In particular, FIG. 5 shows a full set of cooling unit leak detection design. For example, the detectors/substance (e.g., 505, 509) are integrated at different locations, and these locations are possible leakage locations. In an embodiment, in addition, these nanoparticles (e.g., 505, 509) are separate from the fluid area 511, which means they only immerged into the liquid when the fluid flows to the areas which they are not designed to (e.g., leaking). In an embodiment, the sensor 501 is added to the fluid discharge locations of the entire unit which is the outlet 507 shown in the figure. For example, 503 illustrates the fluid flowing direction.

Figure 6A:
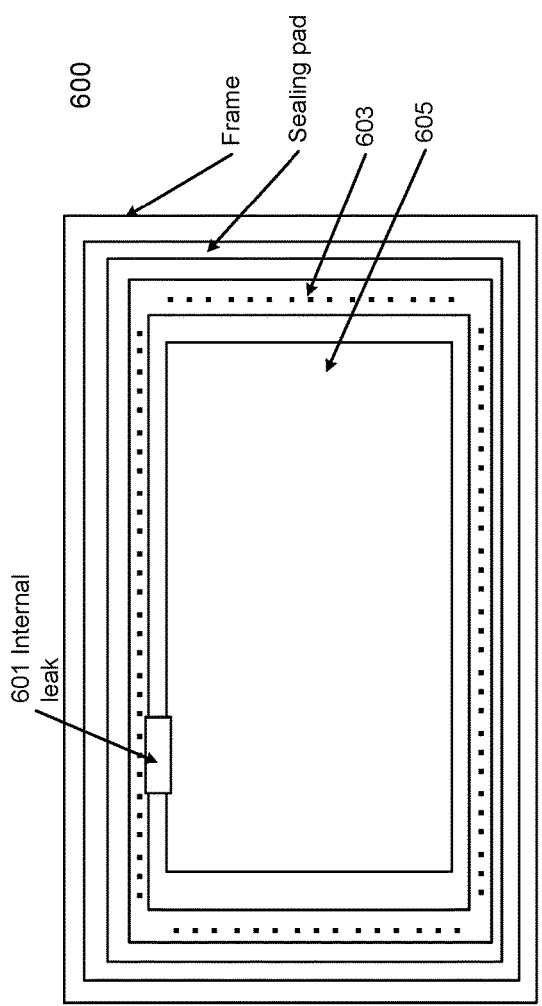
FIG. 6A-6B show an example liquid cooling leakage prevention function and mechanism for a cooling system according to an embodiment of the application.
Figure 6B:
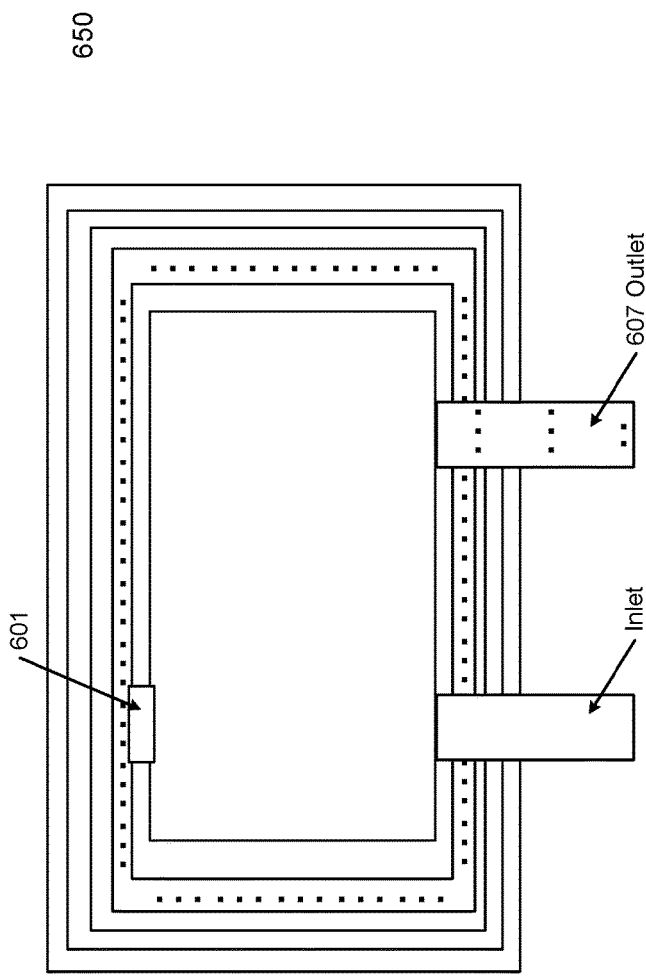

FIG. 6A-6B show an example liquid cooling leakage prevention function and mechanism for a cooling system according to an embodiment of the application. For example, FIG. 6A-6B show the actual sequence 600, 650 of the leak detection system in a leaking incident. In an embodiment, during the first leaking stage (FIG. 6A), since the microchannel fin area 605 should in completely separated from the nanoparticle channel 603, the first stage internal leak is started/happened when the fluid flows into the area 601.

Figure 8:
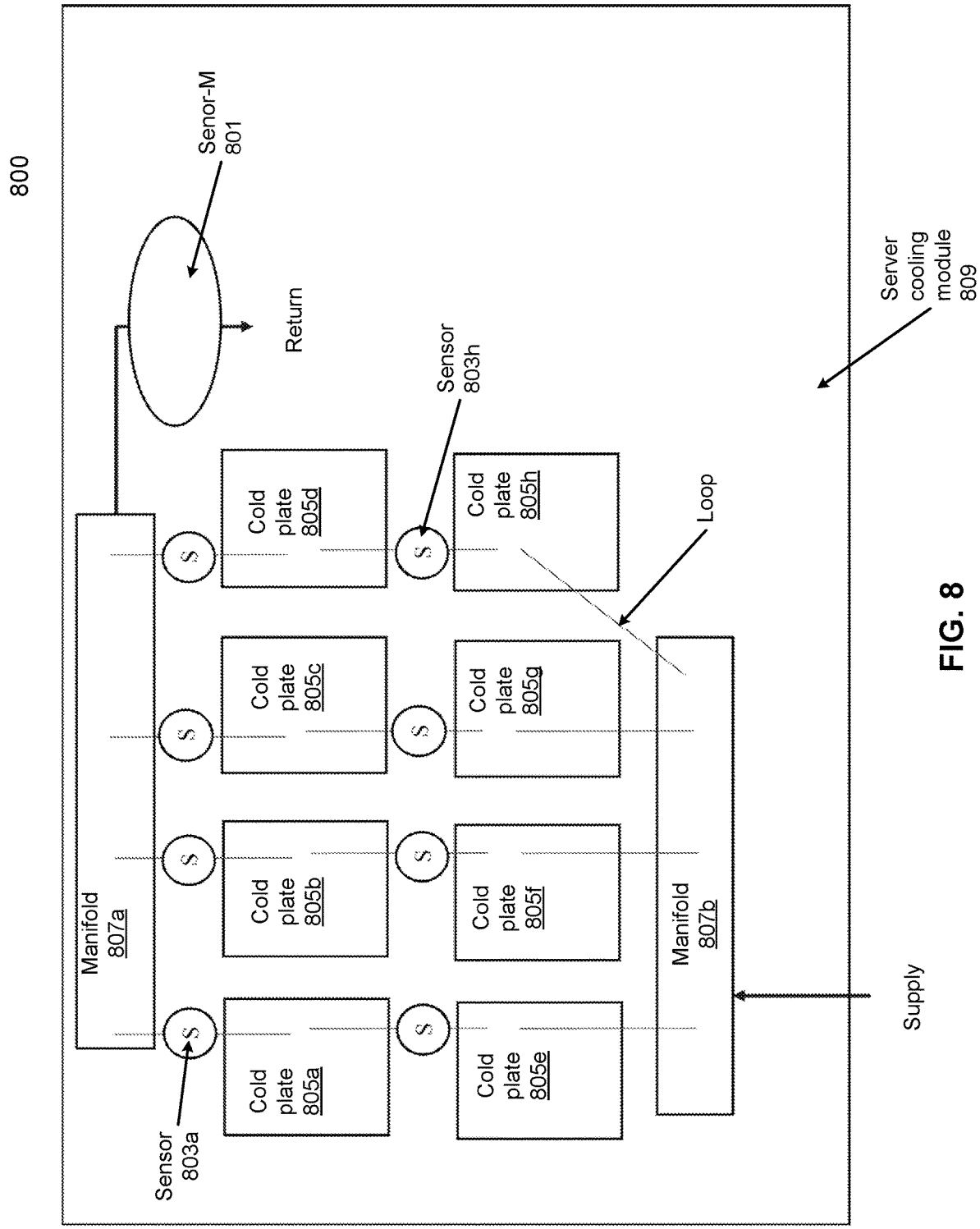
FIG. 8 shows an example server cooling module according to an embodiment of the application.

In an embodiment, during the second leaking stage (FIG. 6A), the fluid flows into the nanoparticle channel 603 through the leaking path (e.g., path 809 of FIG. 8). For example, the leaking path may be caused by product design, manufacture error, improper integration, or through operation, under different pressure and thermal cycles and so on.

In an embodiment, during the third leaking stage (FIG. 6A), the particles in the nanoparticle channel 603 are exposed to the fluid. For example, the nanoparticles (e.g., a copper nanoparticle) in the nanoparticle channel 603 are exposed to the fluid because those particles are covered by the capsule layer which is easily soluble in liquid.

In an embodiment, during the fourth leaking stage (FIG. 6B), the particles flowing together with the fluid along the fluid flowing directions and appeared at the outlet 607. In an embodiment, the sensor in the outlet 607 can detect those particles to identify the internal leak 601 and the location of the internal leak when the entire device is still functioning and no leak outside from the cold plate to the electronics.

Figure 7:
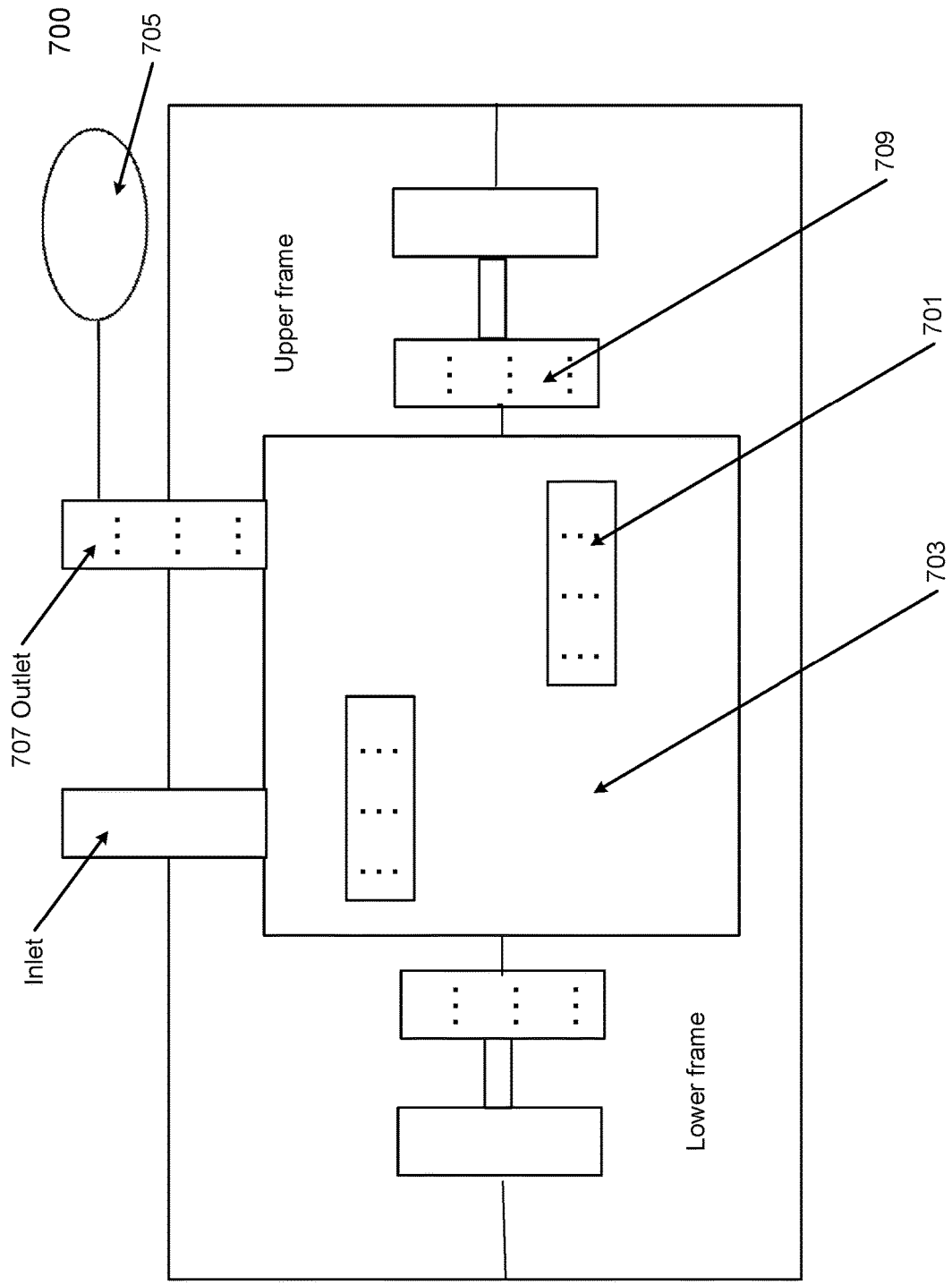
FIG. 7 shows an example liquid cooling leakage prevention design with nanoparticle implementation in a cooling unit of a cooling system according to an embodiment of the application.

FIG. 7 shows an example liquid cooling leakage prevention design 700 with nanoparticle implementation in a cooling unit of a cooling system according to an embodiment of the application. For example, FIG. 7 shows that the design of the operation of a cold plate as an example. In an embodiment, the particles 701 from nanoparticle channel 709 are mixed to the fluid area 703 and the first location (e.g., outlet 707) where it comes out of the device is integrated with the sensor 705.

FIG. 8 shows an example server cooling module 800 according to an embodiment of the application. For example, FIG. 8 shows a server side implementation. In an embodiment, the server has multiple cold plates (e.g., 805a-805h) and manifold (e.g., 807a, 807b) integrated. In an embodiment, a Sensor-M 801 is used for the entire server cooling module 809 and individual sensors (e.g., 803a, 803h) are used at the downstream of each cold plate (e.g., 805a-805h). It should be noted that the nanoparticles are integrated in each individual cold plate (e.g., 805a-805h) and the manifold (e.g., 807a, 807b). In an embodiment, in a leaking incident, based on the sequence of the sensor (e.g., 803a, 803h) detecting signal, detailed locations (e.g., 805a, 805h) can be identified. In addition, the server system redundant design 800 may provide more flexibilities on this redundancy design and sensor accuracy selection.

Figure 9:
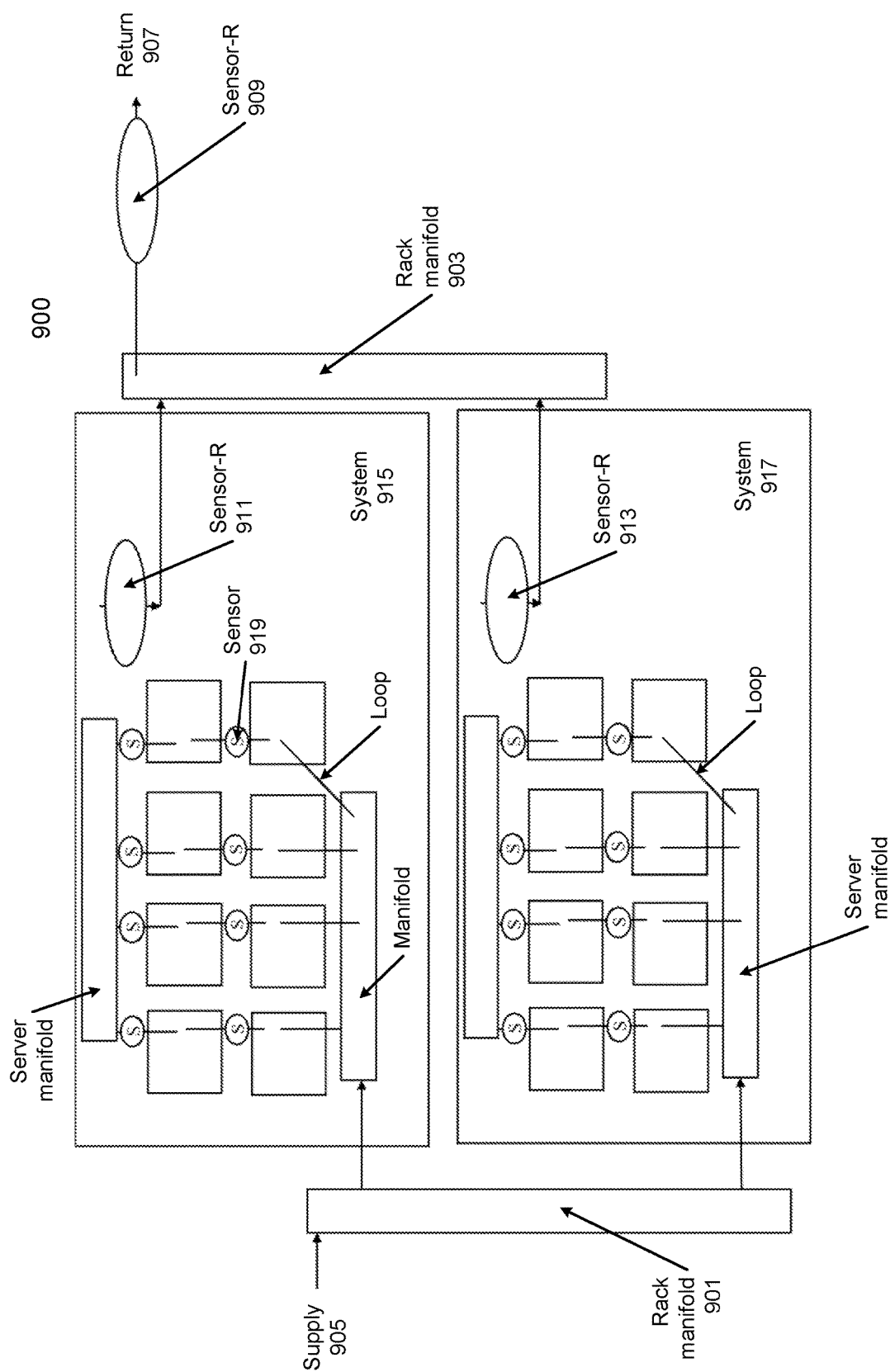
FIG. 9 shows another example server cooling module according to an embodiment of the application.

FIG. 9 shows another example server cooling module 900 according to an embodiment of the application. For example, FIG. 9 shows a rack level design and two systems (i.e., 915, 917) are used. In an embodiment, the system (e.g., 915, 917) are connected with a rack level manifolds (e.g., 901, 903) for supply 905 and return 907. In an embodiment, the rack level can be integrated with a sensor (e.g., Sensor-R 909, 911, 913, 919) as well. In an embodiment, besides the advantages and functions discussed in above paragraphs, the sensor can be integrated to any layer or system locations for better detect the potential leaking locations, for better analyzing the potential leaking. In an embodiment, the implementation of the sensor locations (e.g., 909, 911, 913, 919) may also correlate to the workload and applications deployed on the systems as well as the workload dispatch, migrate methodologies and requirements especially in any leaking scenarios.

It should be noted that the integration of the nanoparticle may differ from device to device in terms of hardware design. For example, other types of nanoparticles may be used. In an embodiment, though all types require the material to be compatible with all other wetted materials on the loop; nonetheless, the nanoparticle modules may be packaged in different manners for the ease of implementation.

FIGS. 8 and 9 show multiple sensors (e.g., 801, 803a, 803h, 909, 911, 913, 919) are installed according to an embodiment. For example, sensors (e.g., 803a, 803h, 909, 911, 913, 919) can be designed and located in different manners in a cooling module or a cooling system to provide different level detection accuracy such as only use one sensor on the downstream of a server cooling module to cover the entire server instead of using individual sensors for each of the cold plate. In other words, in an embodiment, the cooling system does not require to accurately identifying the which cold plate is leaking internally since the accuracy on a server level is sufficient. Alternatively, more sensors may be deployed at various locations to provide finer leak detection. For example, the system with more sensors can detect at a cold plate level. It can detect which of the cold plates that causes the leaking.

Figure 10:
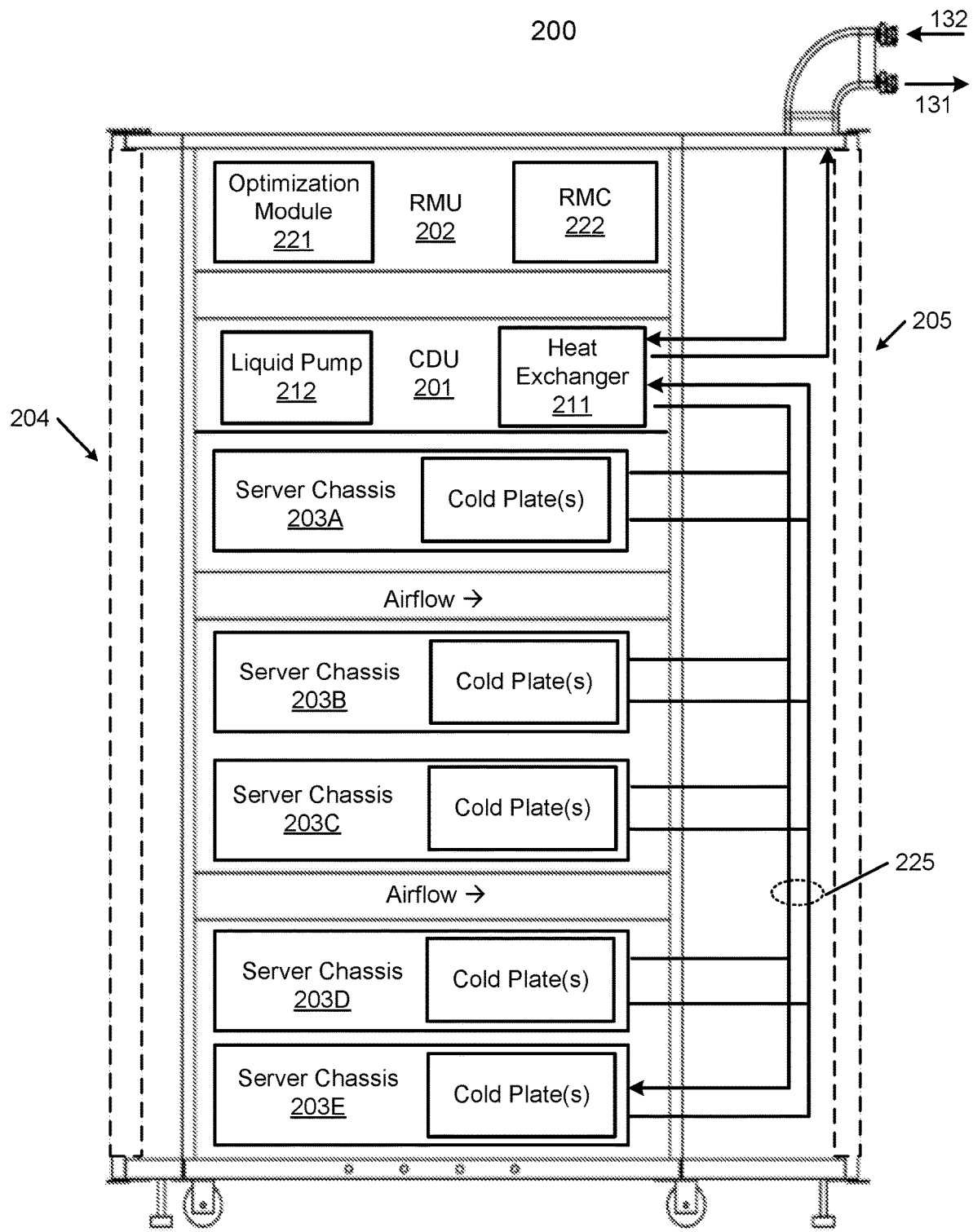
FIG. 10 is a block diagram illustrating an example of an electronic rack according to one embodiment.

FIG. 10 is block diagram illustrating an electronic rack according to one embodiment. Electronic rack 200 may represent any of the electronic racks as described throughout this application. For example, rack 200 may represent the electronic racks in FIG. 9 as a part of liquid cooling leakage prevention design with nanoparticle implementation in a cooling unit of a cooling system including key features of the control communication and rack level leak detection according to an embodiment of the application. Referring to FIG. 10, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the back ends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201.

Each of server chassis 203 may include one or more IT components (e.g., central processing units or CPUs, general/graphic processing units (GPUs), memory, and/or storage devices). Server chassis 203 may include a host server (referred to as a host node) coupled to one or more compute servers (also referred to as computing nodes, such as CPU server and GPU server).

Electronic rack 200 further includes optional RMU 202 configured to provide and manage power supplied to servers 203, and CDU 201. RMU 202 may be coupled to a power supply unit (not shown) to manage the power consumption of the power supply unit.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Note that the rack configuration as shown in FIG. 10 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cold plate for providing liquid cooling, comprising:
an inlet port to receive cooling fluid from an external cooling source;
an outlet port to return the cooling fluid back to the external cooling source;
a sealing notch integrated with a sealing pad included in an outside layer of the cold plate;
a nanoparticle channel disposed inside the outside layer, wherein the nanoparticle channel is filled with a plurality of nanoparticles; and
a cooling area disposed inside the nanoparticle channel, wherein the cooling area is to receive the cooling fluid from the inlet port, to exchange heat generated by an electronic device attached to the cold plate and carried by the fluid, and to return the cooling fluid via the outlet port,
wherein the plurality of nanoparticles in the cooling fluid is used to detect a leakage of the cooling fluid.

2. The cold plate of claim 1, further comprising a capsule layer used for containing the plurality of nanoparticles soluble in the cooling fluid.

3. The cold plate of claim 2, wherein the plurality of nanoparticles with the capsule layer can be dissolved into the cooling fluid.

4. The cold plate of claim 1, wherein the plurality of nanoparticles are integrated to a barb and hose component.

5. The cold plate of claim 1, further comprising a nanoparticle sensor used in a loop coupled with the outlet port of the cold plate to detect the plurality of nanoparticles in the cooling fluid.

6. The cold plate of claim 5, wherein the nanoparticle sensor is located at a downstream of a fluid flowing direction.

7. The cold plate of claim 1, wherein each of the plurality of nanoparticles comprise a copper nanoparticle.

8. The cold plate of claim 1, wherein the plurality of nanoparticles are exposed to the cooling fluid flowing to the nanoparticle channel through the leaking path.

9. The cold plate of claim 8, wherein the plurality of nanoparticles flow together with the cooling fluid appeared in a downstream/discharge side of a loop coupled with the outlet port, when an entire system is still functioning and no leak outside the cold plate onto the electronic device.

10. A server chassis, comprising:
one or more electronic devices operating as one or more servers; and
a cold plate coupled to the one or more electronic devices, the cold plate comprising:
an inlet port to receive cooling fluid from an external cooling source;
an outlet port to return the cooling fluid back to the external cooling source;
a sealing notch integrated with a sealing pad included in an outside layer of the cold plate;
a nanoparticle channel disposed inside the outside layer, wherein the nanoparticle channel is filled with a plurality of nanoparticles; and
a cooling area disposed inside the nanoparticle channel, wherein the cooling area is to receive the cooling fluid from the inlet port, to exchange heat generated by the one or more electronic devices attached to the cold plate and carried by the fluid, and to return the cooling fluid via the outlet port,
wherein the plurality of nanoparticles in the cooling fluid is used to detect a leakage of the cooling fluid.

11. The server chassis of claim 10, wherein the cold plate further comprises a capsule layer used for containing the plurality of nanoparticles soluble in the cooling fluid.

12. The server chassis of claim 11, wherein the plurality of nanoparticles with the capsule layer can be dissolved into the cooling fluid.

13. The server chassis of claim 10, wherein the plurality of nanoparticles are integrated to a barb and hose component.

14. The server chassis of claim 10, wherein the cold plate further comprises one or more nanoparticle sensors used in a loop coupled with the outlet port of the cold plate to detect the plurality of nanoparticles in the cooling fluid.

15. The server chassis of claim 14, wherein the one more nanoparticle sensors are disposed on one or more locations based on one or more leak detection coverage ranges.

16. The server chassis of claim 10, wherein each of the plurality of nanoparticles comprise a copper nanoparticle.

17. The server chassis of claim 10, wherein the plurality of nanoparticles are exposed to the cooling fluid flowing to the nanoparticle channel through the leaking path.

18. An electronic rack of a data center, comprising:
a plurality of server chassis arranged in a stack, each server chassis containing one or more electronic devices operating as one or more servers, each of the electronic devices being attached to a cold plate, each cold plate comprising:
an inlet port to receive cooling fluid from an external cooling source;
an outlet port to return the cooling fluid back to the external cooling source;
a sealing notch integrated with a sealing pad included in an outside layer of the cold plate;
a nanoparticle channel disposed inside the outside layer, wherein the nanoparticle channel is filled with a plurality of nanoparticles; and
a cooling area disposed inside the nanoparticle channel, wherein the cooling area is to receive the cooling fluid from the inlet port, to exchange heat generated by the one or more electronic devices attached to the cold plate and carried by the fluid, and to return the cooling fluid via the outlet port,
wherein the plurality of nanoparticles in the cooling fluid is used to detect a leakage of the cooling fluid.

* * * * *